(12) United States Patent
Kurosaki

(10) Patent No.: US 7,263,007 B2
(45) Date of Patent: Aug. 28, 2007

(54) SEMICONDUCTOR MEMORY DEVICE USING READ DATA BUS FOR WRITING DATA DURING HIGH-SPEED WRITING

(75) Inventor: Kazuhide Kurosaki, Tokyo (JP)

(73) Assignee: Spansion LLC, Sunnyvale, CA (US)

( * ) Notice: Subject to any disclaimer, the term of this patent is extended or adjusted under 35 U.S.C. 154(b) by 53 days.

(21) Appl. No.: 11/228,777

(22) Filed: Sep. 16, 2005

(65) Prior Publication Data

US 2006/0067148 A1   Mar. 30, 2006

Related U.S. Application Data

(63) Continuation of application No. PCT/JP04/014327, filed on Sep. 30, 2004.

(51) Int. Cl.
*G11C 7/10* (2006.01)

(52) U.S. Cl. ................ 365/189.01; 365/189.04

(58) Field of Classification Search ....... 365/189.01 O, 365/189.03, 189.04 X, 206, 230.03, 230.05; 710/20, 27, 307
See application file for complete search history.

(56) References Cited

U.S. PATENT DOCUMENTS

| | | | |
|---|---|---|---|
| 6,240,040 B1 | 5/2001 | Akaogi et al. | 365/230 |
| 6,587,905 B1* | 7/2003 | Correale et al. | 710/107 |
| 2002/0097609 A1 | 7/2002 | Shiga et al. | 365/189 |
| 2003/0048686 A1 | 3/2003 | Taura | 365/189 |
| 2003/0128593 A1 | 7/2003 | Shiga et al. | 365/189 |
| 2004/0240288 A1* | 12/2004 | Takahashi | 365/202 |

FOREIGN PATENT DOCUMENTS

| | | |
|---|---|---|
| JP | 2002-133899 | 5/2002 |
| JP | 2002-216483 | 8/2002 |
| JP | 2003-85989 | 3/2003 |
| JP | 2003-527724 | 9/2003 |

* cited by examiner

*Primary Examiner*—VanThu Nguyen

(57) ABSTRACT

A semiconductor device is provided that can perform simultaneous writing of a large number of bits, without an increase in chip size. This semiconductor device includes: a write data bus via which data are written into memory cells; a read data bus via which the data are read from the memory cells; a first write amplifier that writes data into the memory cells via the read data bus at the time of high-speed writing; a second write amplifier that writes data into the memory cells via the write data bus at the time of high-speed writing; a first sense amplifier that reads verified data from the memory cells via the read data bus; and a second sense amplifier that reads verified data from the memory cells via the write data bus.

25 Claims, 9 Drawing Sheets

SEMICONDUCTOR MEMORY DEVICE USING READ DATA BUS FOR WRITING DATA DURING HIGH-SPEED WRITING

CROSS REFERENCE TO RELATED APPLICATIONS

This is a continuation of International Application No. PCT/JP2004/014327, filed Sep. 30, 2004.

BACKGROUND OF THE INVENTION

1. Field of the Invention

The present invention relates to semiconductor devices and data write methods.

2. Description of the Related Art

Flash memories are being widely used as non-volatile memories that can electrically rewrite data. However, the time required for rewriting data in a flash memory is very much longer than that in a semiconductor memory device such as a DRAM or SRAM. Moreover, the controller that controls a flash memory cannot access the flash memory while data is being rewritten.

To solve the above problems, a flash memory of a dual operation type has been developed recently. Such a flash memory has its inside divided into banks, and can read data from one of the banks while rewriting data in another one of the banks. Here, a "bank" is a block or the group consisting of two or more arbitrarily combined blocks, and "banks" are memory banks that can perform data processing at the same time.

Next, a conventional flash memory of the dual operation type is described. FIG. 1 is a block diagram of the conventional flash memory of the dual operation type. As shown in FIG. 1, the flash memory 1 includes a cell array 2, a read sense amplifier 3, a write sense amplifier 4, and a write amplifier 5. The cell array 2 includes banks BANK0 through BANKn. The memory cells of each of the banks BANK0 through BANKn is managed by the sector. Y-gates 21 are connected to read data buses RDB0 through RDBm and write data buses WDB0 through WDBm.

The read sense amplifier 3 reads data from the memory cells via the read data buses RDB0 through RDBm. The write sense amplifier 4 reads verified data from the memory cells via the write data buses WDB0 through WDBm. The write amplifier 5 writes data into the memory cells via the write data buses WDB0 through WDBm. In this flash memory of the dual operation type, data can be read from a bank while data is rewritten in another bank.

Such a flash memory of the dual operation type is disclosed in U.S. Pat. No. 6,240,040.

In the above flash memory 1 of the dual operation type, however, high-speed writing cannot be performed, because, in a case where an internal power supply is employed, the number of bits that can be written at once is limited by the restriction on the current capacity of the high-voltage generating circuit mounted on the chip. If high-speed writing is to be performed using an external power supply, a large number of bits can be written at once, as there is no limitation on the number of bits that can be written at once. However, to write a large number of bits at once, the same number of write data buses as the number of bits are required. As the number of write data buses increases, the chip size also increases, which is not desirable.

SUMMARY OF THE INVENTION

It is therefore an object of the present invention to provide a semiconductor device and a data write method in which the above disadvantage is eliminated.

A more specific object of the present invention is to provide a semiconductor device and a data write method by which writing can be performed in a large number of bits at once without an increase in chip size.

The above objects of the present invention are achieved by a semiconductor device that includes: a write data bus via which data are written into memory cells; a read data bus via which data are read from the memory cells; and a first write amplifier that writes data into the memory cells via the read data bus at the time of given writing. In accordance with the present invention, in a case where a number of read data buses are employed like a burst mode structure or a page mode structure, those read data buses are used as write data buses at the time of high-speed writing, for example. By doing so, a large number of bits can be written in the memory cells, and accordingly, high-speed writing can be realized. Also, data writing can be performed using data buses that are not being used during a high-speed writing operation. Accordingly, there is no need to employ data buses especially for writing, and the chip size does not increase.

The semiconductor device further includes a second write amplifier that writes data into the memory cells via the write data bus at the time of given writing. In accordance with the present invention, using the write data bus and the read data bus for data writing, a larger number of bits can be written at once in the memory cell. Thus, high-speed writing can be performed.

The semiconductor device further includes: shield lines that shield the read data bus; and a third write amplifier that writes data into the memory cells via the shield lines at the time of given writing. In accordance with the present invention, the shield lines for each read data bus are used as a write data bus at the time of high-speed writing. Accordingly, an even larger number of bits can be written at once in the memory cells, and high-speed writing can be performed.

The above objects of the present invention are also achieved by a semiconductor device that includes: shield lines that shield a read data bus via which data are read from memory cells; and a third write amplifier that writes data into the memory cells via the shield lines. In accordance with the present invention, the shield lines for each read data bus are used as a write data bus at the time of high-speed writing. Accordingly, a large number of bits can be written at once into the memory cells, and data can be written at high speed. The semiconductor device of the present invention further includes a write data bus via which data are written into the memory cells.

The semiconductor device further includes a first sense amplifier that reads verified data from the memory cells via the read data bus. In accordance with the present invention, the read data bus is used to read verified data, and accordingly, data can be read from the memory cells at high speed.

The semiconductor device further includes a second sense amplifier that reads verified data from the memory cells via the write data bus. In accordance with the present invention, the write data bus and the read data bus are used to read verified data, so that data can be read from the memory cells at high speed.

The semiconductor device further includes a third sense amplifier that reads verified data from the memory cells via the shield lines. In accordance with the present invention, the shield lines are used to read verified data, so that data can be read from the memory cells at high speed.

The semiconductor device further includes a sense amplifier that reads data from the memory cells via the read data bus. In accordance with the present invention, data can be read from the memory cells via the read data bus.

The semiconductor device further includes a cell array including banks in which data are read from a first one of the banks while data are written into a second one of the banks. In accordance with the present invention, high-speed data reading can be performed suitably for a dual operation.

The semiconductor device further includes: a cell array including banks in which data are read from a first one of the banks while data are written into a second one of the banks; and sense amplifiers each of which is provided for a respective one of the banks, each of the sense amplifiers reading data from the memory cells via the read data bus. In accordance with the present invention, even if a read sense amplifier is provided for each one bank, data can be written into the memory cells via the shield lines at high speed.

The semiconductor device further includes a cell array including banks in which data are read from a first one of the banks while data are written into a second one of the banks. In this semiconductor device, the read data bus is provided for each of the banks. In accordance with the present invention, even if a read data bus is provided for each one bank, the shield lines for read data buses are used to write data into the memory cells at high speed.

The semiconductor device further includes: a cell array including banks in which data are read from a first one of the banks while data are written into a second one of the banks; and a select circuit that generates a select signal for bank selection. In accordance with the present invention, a bank can be selected so that data can be written at high speed.

The semiconductor device further includes a switch that connects the first write amplifier to the read data bus at the time of given writing. In accordance with the present invention, the first write amplifier is connected to the read data bus, so that data can be written into the memory cells at high speed.

The semiconductor device further includes a switch that connects the third write amplifier to the shield lines at the time of given writing. In accordance with the present invention, the third write amplifier is connected to the shield lines, so that data can be written into the memory cells at high speed.

The semiconductor device further includes: a cell array including banks in which data are read from a first one of the banks while data are written into a second one of the banks; and a switch that selects one of the banks to be connected to the read data bus. In accordance with the present invention, the memory cells in each bank can be connected to the read data bus.

The semiconductor device further includes: a cell array including banks in which data are read from a first one of the banks while data are written into a second one of the banks; and a switch that selects one of the banks to be connected to the shield lines. In accordance with the present invention, the memory cells in each bank can be connected to the shield lines.

In this semiconductor device, the read data bus has a larger number of lines than the write data bus. In accordance with the present invention, in the case of a burst mode structure or a page mode structure, the read data bus with a larger number of lines than the write data bus is used, so that data can be written into the memory cells at high speed. The semiconductor device is a semiconductor memory device.

The above objects of the present invention are also achieved by a method of writing data, including the steps of: writing data into memory cells via a write data bus; reading data from the memory cells via a read data bus; and writing data into the memory cells via the read data bus at the time of given writing. In accordance with the present invention, in a case where a number of read data buses are employed like a burst mode structure or a page mode structure, those read data buses are used as write data buses at the time of high-speed writing, for example. By doing so, a large number of bits can be written in the memory cells, and accordingly, high-speed writing can be realized. Also, data writing can be performed using data buses that are not being used during a high-speed writing operation. Accordingly, there is no need to employ data buses especially for writing, and the chip size does not increase.

The method further includes the step of writing data into the memory cells via the write data bus at the time of given writing. In accordance with the present invention, the write data bus and the read data bus are used for data writing. Thus, a larger number of bits can be written at once, and high-speed writing can be performed.

The method further includes the step of writing, at the time of given writing, data into the memory cells via shield lines that shield the read data bus. In accordance with the present invention, the shield lines for each read data bus are used as a write data bus at the time of high-speed writing. Accordingly, an even larger number of bits can be written at once, and high-speed writing can be performed.

The above objects of the present invention are also achieved by a method of writing data, including the steps of: reading data from memory cells via a read data bus; and writing, at the time of given writing, data into the memory cells via shield lines that shield the read data bus. In accordance with the present invention, the shield lines for each read data bus are used as a write data bus at the time of high-speed writing. Thus, a large number of bits can be written at once, and data can be written at high speed.

The method further includes the step of reading verified data from the memory cells via the read data bus. In accordance with the present invention, the read data bus is used to read verified data, so that data can be read from the memory cells at high speed.

The method further includes the step of reading verified data from the memory cells via the write data bus. In accordance with the present invention, the write data bus and the read data bus are used to read verified data, so that data can be read from the memory cells at high speed.

The method further includes the step of reading verified data from the memory cells via the shield lines. In accordance with the present invention, the shield lines are used to read verified data, so that data can be read from the memory cells at high speed.

The method further includes the step of generating a select signal that selects one of banks that have the memory cells. In accordance with the present invention, a bank in which data can be written at high speed can be selected.

The method further includes the step of reading data from a second one of banks while writing data into a first one of the banks. In accordance with the present invention, a semiconductor device of the dual operation type can be provided.

As described so far, the present invention can provide a semiconductor device and a data write method with and by which a large number of bits can be written at once, without an increase in chip size.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

The following is a description of embodiments of the present invention, with reference to the accompanying drawings.

First Embodiment

Figure 1:
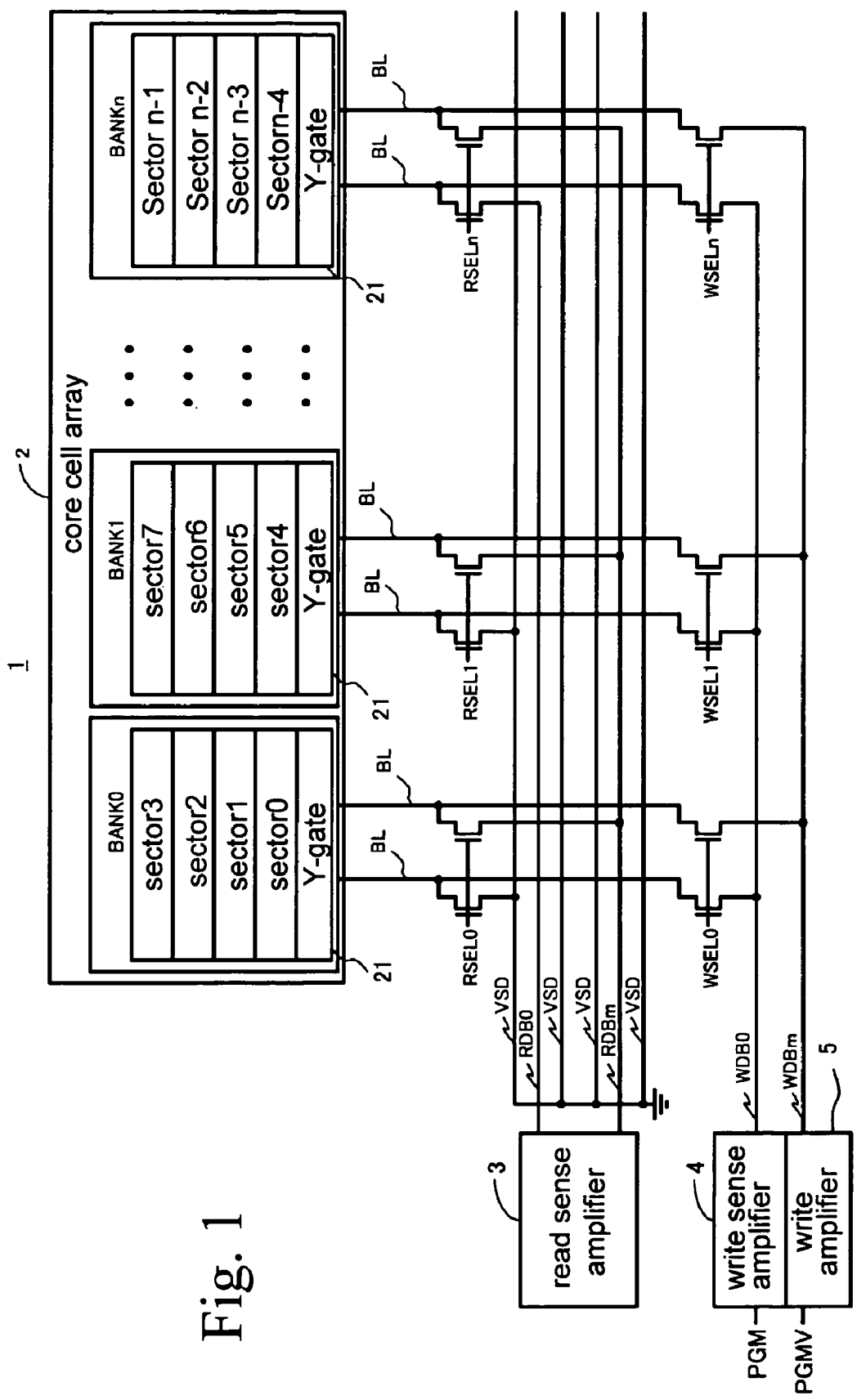
FIG. 1 is a block diagram of a conventional flash memory of a dual operation type.
Figure 2:
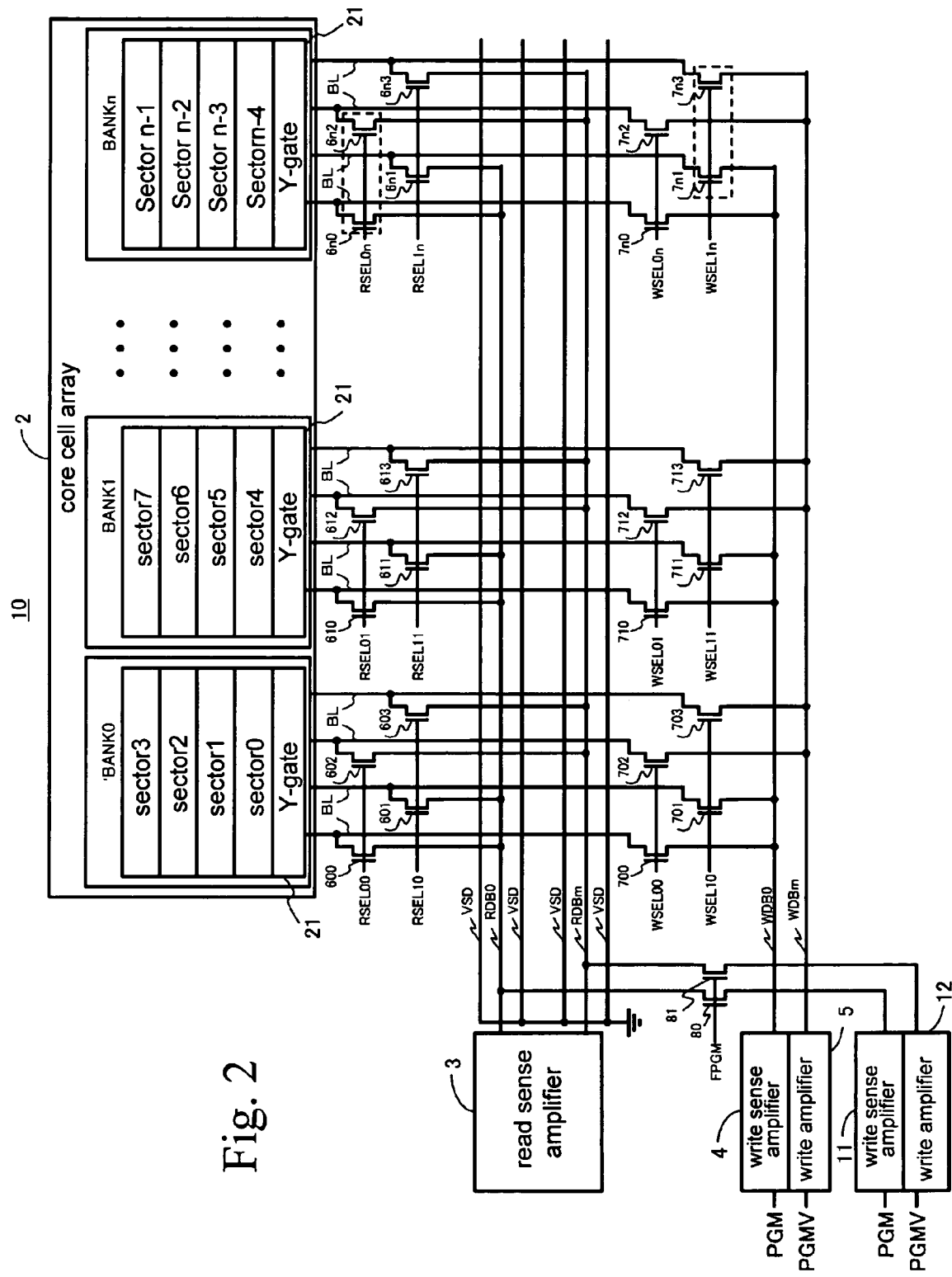
FIG. 2 illustrates the structure of a semiconductor device in accordance with a first embodiment.

FIG. 2 illustrates the structure of a semiconductor device in accordance with a first embodiment of the present invention. As shown in FIG. 2, a semiconductor device 10 includes a core cell array 2, a read sense amplifier 3, a write sense amplifier 4, a write amplifier 5, a write sense amplifier 11, and a write amplifier 12. The semiconductor device 10 also includes write data buses WDB0 through WDBm, read data buses RDB0 through RDBm, and shield lines VSD. The same components as those shown in FIG. 1 are denoted by the same reference numerals as those shown in FIG. 1.

The semiconductor device 10 may be a semiconductor memory device such as a flash memory that is packaged independently, or may be incorporated as part of a semiconductor device such as a system LSI. This semiconductor device 10 is of a dual operation type that can read data from a part while erasing or writing data in another part. In a dual operating mode, the semiconductor device 10 can write data into memory cells at normal speed. However, at the time of high-speed writing, the dual operation mode is prohibited, so that data can be written into the memory cells at high speed.

The core cell array 2 includes banks BANK0 through BANKn. While data are written into the memory cell of a first one of the banks, data can be read from the memory cell of a second one of the banks. The memory cell of each of the banks BANK0 through BANKn is formed with sectors. Y-gates 21 are connected to the read data buses RDB0 through RDBm and the write data buses WDB0 through WDBm via bit lines BL. The write data buses WDB0 through WDBm are used to write data into the memory cells. The read data buses RDB0 through RDBm are used to read data from the memory cells. The shield lines VSD shield the read data buses RDB0 through RDBm.

The read sense amplifier 3 is a current comparator circuit that reads data from the memory cells via the read data buses RDB0 through RDBm, compares the current read from the memory cells with a reference current, amplifies the current difference, and outputs the amplified current difference. The write sense amplifier 4 reads verified data from the memory cells via the write data buses WDB0 through WDBm at the time of regular writing and high-speed writing. The write amplifier 5 writes data into the memory cells via the write data buses WDB0 through WDBm at the time of regular writing and high-speed writing.

The write sense amplifier 11 is a sense amplifier for high speed writing. At the time of high-speed writing, the write sense amplifier 11 reads verified data from the memory cells via the read data buses RDB0 through RDBm. With the write sense amplifier 11, program verification can be performed for two words at once. Since the read data bus RDBm is connected to the read sense amplifier 3, verified data may be read out via the read sense amplifier 3, without the addition of the write sense amplifier 11. The write amplifier 12 writes data into the memory cells via the read data buses RDB0 through RDBm at the time of high-speed writing.

NMOS transistors 80 and 81 are switches that connect the write sense amplifier 11 and the write amplifier 12 to the read data buses RDB0 through RDBm at the time of high-speed writing.

The bit lines BL of the banks BANK0 through BANKn are connected to the read data buses RDB0 through RDBm via NMOS transistors 600 through 6$n$3 that have bank select signals RSEL00 through RSEL1$n$ as gate inputs. The bits lines BL of the banks BANK0 through BANKn are also connected to the write data buses WDB0 through WDBm via NMOS transistors 700 through 7$n$3 that have bank select signals WSEL00 through WSEL1$n$ as gate inputs. Here, m is an input/output serial number that is an integer of 0 through 15.

If the bank BANKn is in a reading state, the bank select signal RSEL0$n$ or RSEL1$n$ switches to high level, and the read sense amplifier 3 reads data via the read data buses RDB0 through RDBm. At this point, 16 bits (1 word) can be read out at once. If the bank BANKn is in a programming or verifying state, the bank select signal WSEL0$n$ or WSEL1$n$ switches to high level, and the write sense amplifier 4 and the write amplifier 5 perform programming and verification via the write data buses WDB0 through WDBm. Thus, 16 bits (1 word) can be written at once.

Normally, the bank select signals RSEL0$n$, RSEL1$n$, WSEL0$n$, and WSEL1$n$ are controlled for each of the banks BANK1 through BANKn, so that reading and writing can be performed at the same time. Thus, a dual operation function is realized.

At the time of high-speed writing, a signal FPGM switches to high level, and the write sense amplifier 11 and the write amplifier 12 for high-speed writing are connected to the read data buses RDB0 through RDBm via the NMOS transistors 80 and 81. The selecting of the bank BANKn is carried out by switching the bank select signals RSEL0$n$ and WSEL1$n$ to HIGH, and the bank select signals RSEL1$n$ and WSEL0n to LOW. The transistors that are surrounded by a dotted line are then turned on. When a signal PGM is HIGH, twice as many bits as in a regular writing operation is written at the same time, so that program verification can be performed, with a signal PGMV being HIGH. Thus, two words (32 bits) can be written at once.

Figure 3:
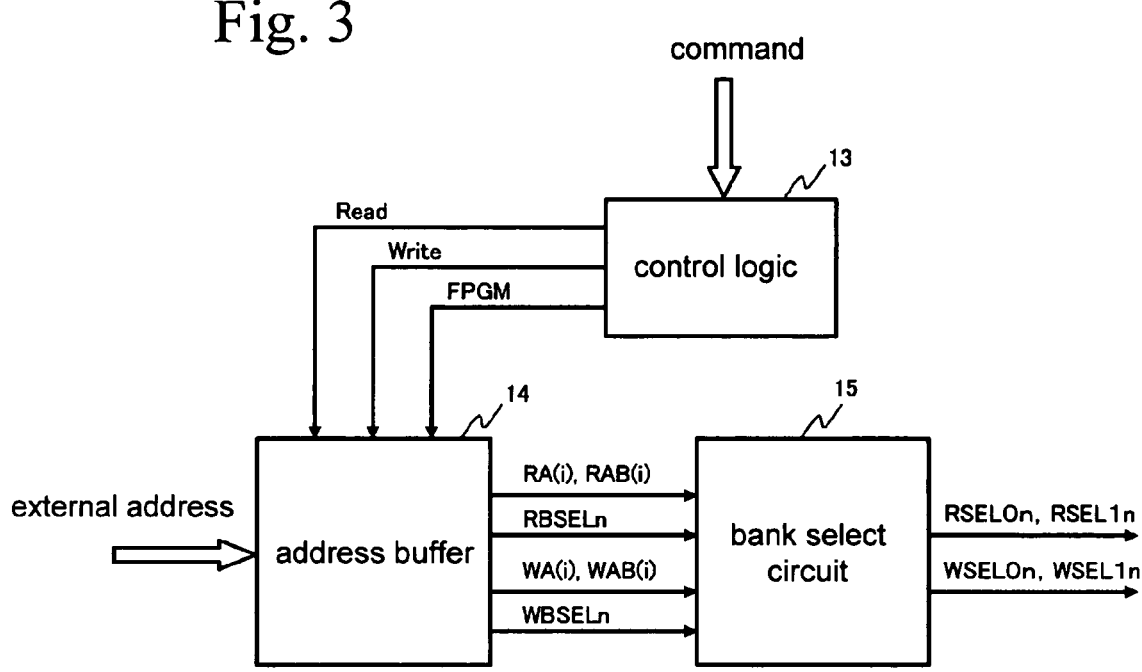
FIG. 3 illustrates the structure that generates a bank select signal in the semiconductor device in accordance with the first embodiment.

FIG. 3 illustrates the structure that generates the bank select signals in the semiconductor device 10 in accordance with the first embodiment. As shown in FIG. 3, the semiconductor device 10 includes a control logic 13, an address buffer 14, and a bank select circuit 15. The control logic 13 receives external commands, generates signals Read, Write, and FPGM, and sends the signals to the address buffer 14. The external commands include write commands and high-speed write commands.

The address buffer 14 receives an external address A(i) and the signals Read, Write, and FPGM from the control logic 13, and generates read internal addresses RA(i) and RAB(i), a read bank select signal RBSELn, write internal addresses WA(i) and WAB(i), and a write bank select signal WBSELn. The read internal address RAB(i) is an inversion signal of the read internal address RA(i). The write internal address WAB(i) is an inversion signal of the write internal address WA(i). The bank select circuit 15 generates the select signals RSEL0n, RSEL1n, WSEL0n, and WSEL1n for selecting the banks BANK0 through BANKn.

Figure 4:
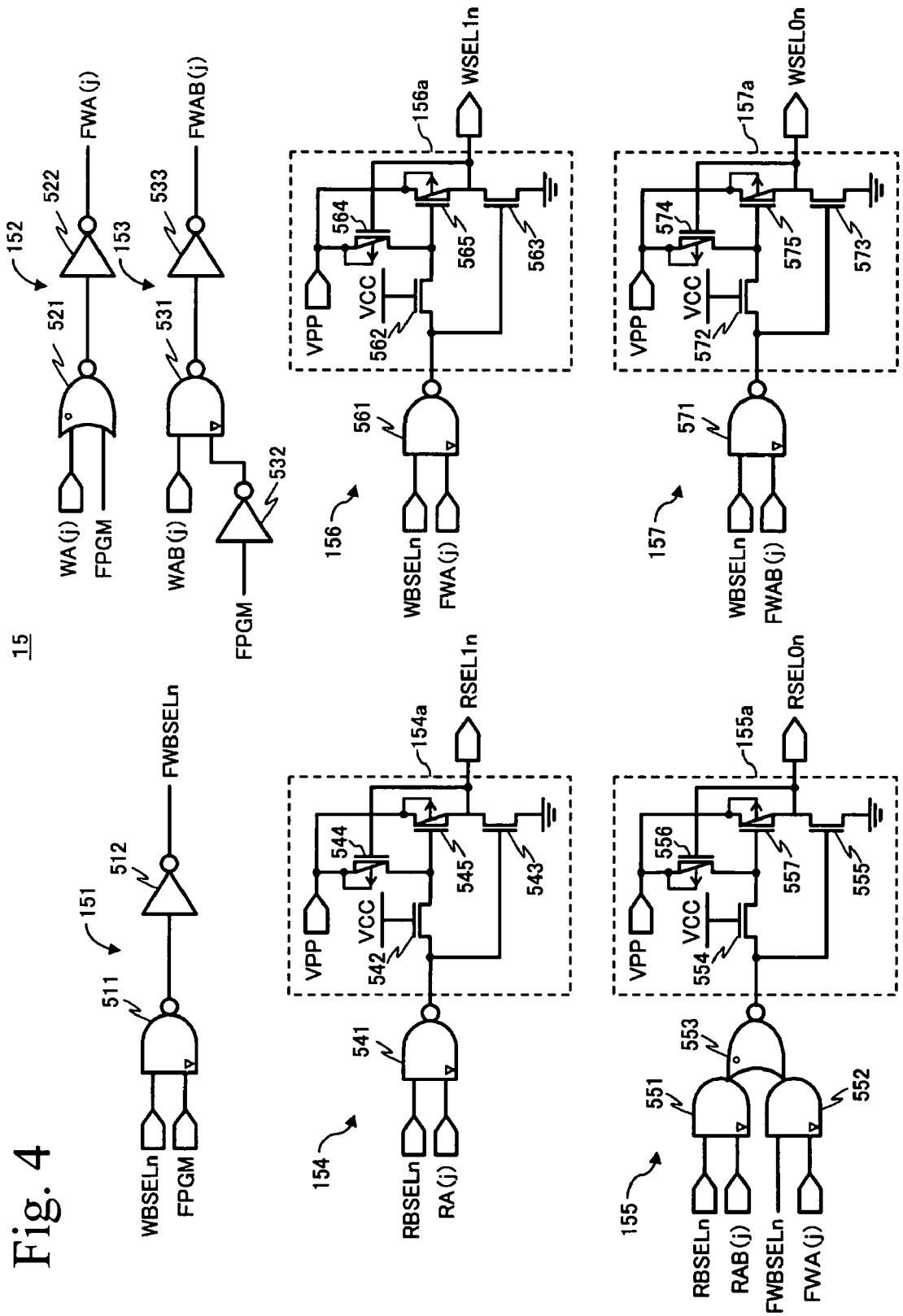
FIG. 4 illustrates the bank select circuit in accordance with the first embodiment.

Next, the bank select circuit 15 is described. FIG. 4 illustrates the structure of the bank select circuit 15 that generates the bank select signals. The bank select circuit 15 includes circuits 151 through 157, and generates the bank select signals RSEL0n, RSEL1n, WSEL0n, and WSEL1n. The circuit 151 includes aNAND circuit 511 and an inverter 512, and generates a signal FWBSELn from the signal WBSELn and the signal FPGM. The circuit 152 and 153 force the bank select signals RSEL0n and WSEL1n to HIGH at the time of high-speed programming of the bank BANKn.

The circuit 152 includes a NOR circuit 521 and an inverter, and generates a signal FWA(j) from a signal WA(j) and the signal FPGM. The circuit 153 includes a NAND circuit 531 and inverters 532 and 533, and generates a signal FWAB(j) from a signal WAB(j) and the signal FPGM. In the circuits 154 through 157, inverter circuits 154a through 157a shift input signals of VCC level to output signals of VPP level. The circuit 154 includes a NAND circuit 541, NMOS transistors 542 and 543, and PMOS transistors 544 and 545. The circuit 154 generates the bank select signal RSEL1n from the signal RBSELn and a signal RA(j).

The circuit 155 includes NAND circuits 551 and 552, a NOR circuit 553, NMOS transistors 554 and 555, and PMOS transistors 556 and 557. The circuit 155 generates the bank select signal RSEL0n from the signal RBSELn, a signal RAB(j), a signal RWBSELn, and the signal FWA(j). The circuit 156 includes a NAND circuit 561, NMOS transistors 562 and 563, and PMOS transistors 564 and 565. The circuit 156 generates the bank select signal WSEL1n from the signal WBSELn and the signal FWA(j).

The circuit 157 includes a NAND circuit 571, NMOS transistors 572 and 573, and PMOS transistors 574 and 575. The circuit 157 generates the bank select signal WSEL0n from the signal WBSELn and the signal FWAB(j). Normally, when the bank BANKn is in a reading state, the signal RBSELn from the address buffer 14 becomes HIGH, and, when the bank BANKn is in a writing state, the signal WBSELn becomes HIGH. The bank select signals RSEL0n and RSEL1n are selected with the read addresses RAB(j) and RA0), and the bank select signals WSEL0n and WSEL1n are selected with the write addresses WAB(j) and WA(j). At the time of high-speed writing, the signal FPGM becomes HIGH. Regardless of the signals WA(j) and the signal WAB(j), the internal signal FWA(j) becomes HIGH and the internal signal FWAB(j) becomes LOW, so that the bank select signals RSEL0n and WSEL1n are selected.

Figure 5:
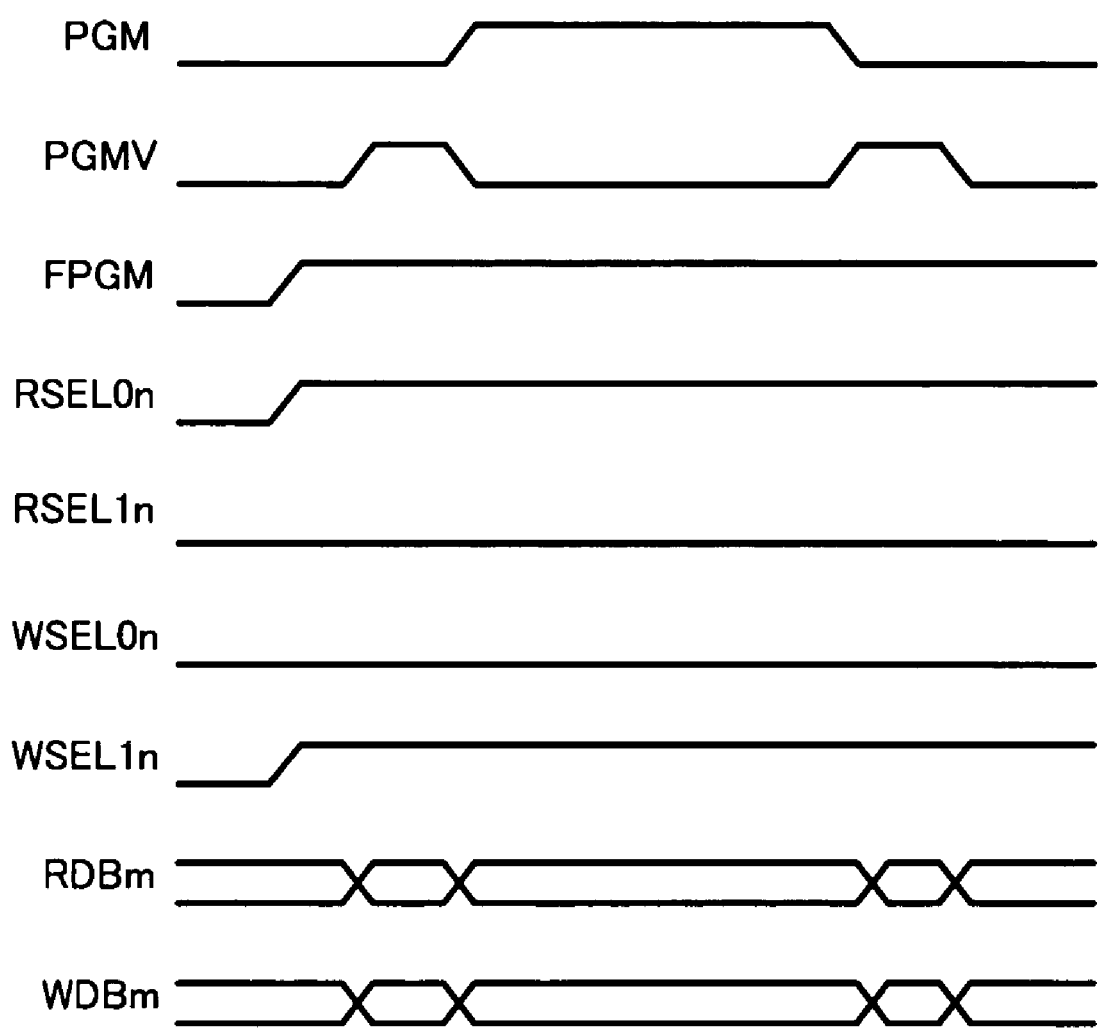
FIG. 5 is a timing chart of a high-speed writing operation of the semiconductor device in accordance with the first embodiment.

Next, the operation of the semiconductor device in accordance with the first embodiment is described. FIG. 5 is a timing chart of a high-speed writing operation of the semiconductor device in accordance with the first embodiment. At the time of high-speed writing, a user successively inputs two addresses and two sets of data (two sets of 16-bit data, i.e., 32 bits in total), together with a high-speed write command FPGM. At this point, the most significant address A(j) for column selection (select transistors 6n0 through 6n3 and 7n0 through 7n3) is switched between HIGH and LOW so as to input the addresses. The other addresses A(i) are the same. The two sets of data are latched by the write amplifiers 5 and 12. When the signal PGMV becomes HIGH, program verification is started.

In the program verification, the signals FWA(j) and FWAB(j) are forced to HIGH and LOW, as shown in FIG. 4. Also, in the selected bank BANKn, the bank select signals RSEL0n and WSEL1n are always HIGH, and the bank select signals RSEL1n and WSEL0n are always LOW. During a program verifying period, with the signal PGMV being HIGH, the verified data are supplied to the read data buses RDB0 through RDBm and the write data buses WDB0 through WDBm, and program verification is performed on the 32 bits (2 words) at once.

During a programming period, with the signal PGM being HIGH, a program voltage is supplied to the read data buses RDB0 through RDBm and the write data buses WDB0 through WDBm, and writing is performed on the 32 bits at once. During a program verifying period, with the signal PGMV being HIGH, verified data are supplied to the read data buses RDB0 through RDBm and the write data buses WDB0 through WDBm, and program verification is performed on the 32 bits (2 words) at once. When the program verification passes, the high-speed writing comes to an end, and the signal FPGM becomes LOW. If another high-speed data writing operation is to follow, the command FPGM is again input, and the above procedures are repeated.

In accordance with the first embodiment, in a flash memory that can perform reading and writing at the same time and have read data buses and write data buses, simultaneous operations of reading and writing are prohibited at the time of high-speed writing, and the read data buses and the write data buses are used as write data buses to write a large number of bits at once. Thus, high-speed writing is realized. Also, there is no need to prepare write data buses. Thus, an increase in chip size can be prevented.

Second Embodiment

Figure 6:
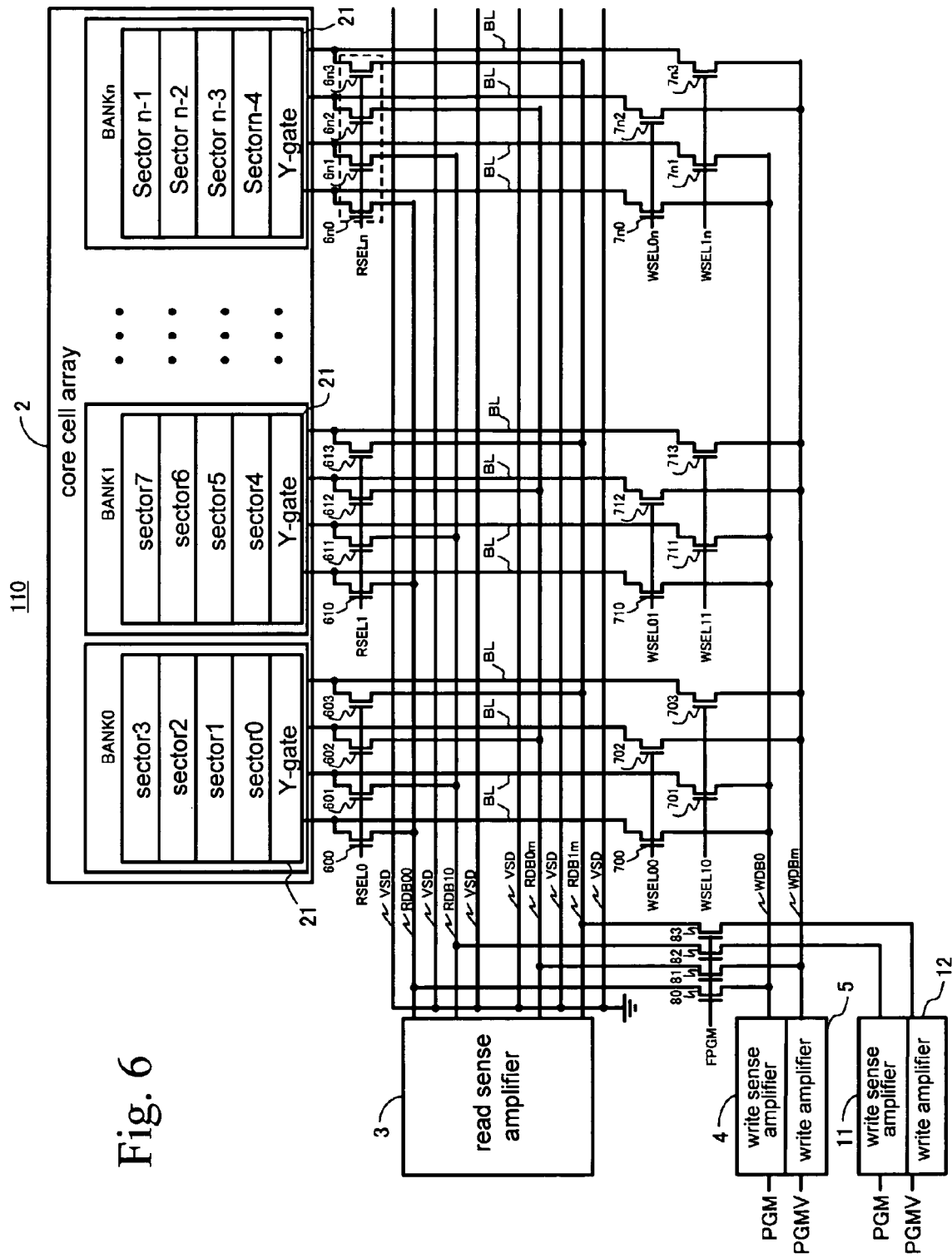
FIG. 6 illustrates the structure of a semiconductor device in accordance with a second embodiment.

Next, a second embodiment of the present invention is described. FIG. 6 illustrates the structure of a semiconductor device in accordance with the second embodiment. As shown in FIG. 6, the semiconductor device 110 includes a core cell array 2, a read sense amplifier 3, a write sense amplifier 4, a write amplifier 5, a write sense amplifier 11, and a write amplifier 12. Like the semiconductor device of the first embodiment, the semiconductor device 110 further includes a control logic 13, an address buffer 14, and a bank select circuit 15. This semiconductor device 110 is of a dual operation type that can read data from a part while erasing or writing data in another part, and operates in burst mode or page mode.

The write data buses WDB0 through WDBm are used to write data into memory cells. The read data buses RDB00 through RDB1m are used to read data from the memory cells. The read data buses RDB00 through RDB1m include more lines than the write data buses WDB0 through WDBm. At the time of reading in a burst mode structure or a page mode structure, two or more words (two words in this example) are accessed at the same time. Therefore, the data of two words are read into the two buses of the read data bus RDB0m and the read data bus RDB1m at the same time for an input/output terminal I/Om. Shield lines VSD shield the read data buses RDB00 through RDB1m.

The core cell array 2 includes banks BANK0 through BANKn that can read data from the memory cell of a second bank while writing data into the memory cell of a first bank. The memory cell of each of the banks BANK0 through BANKn is formed with sectors. The read sense amplifier 3 is a current comparator circuit that can read data from the memory cells via the read data buses RDB00 through RDB1m. The read sense amplifier 3 compares the current read from each memory cell with a reference current, amplifies the current difference, and outputs the amplified difference.

At the time of regular writing, the write sense amplifier 4 reads verified data from the memory cells via the write data buses WDB0 through WDBm. At the time of high-speed writing, the write sense amplifier 4 reads verified data from the memory cells via the read data buses RDB00 through RDB0m. At the time of regular writing, the write amplifier 5 writes data via the write data buses WDB0 through WDBm. At the time of high-speed writing, the write amplifier 5 reads verified data from the memory cells via the read data buses RDB00 through RDB0m.

The write sense amplifier 11 is a sense amplifier for high-speed programming. At the time of high-speed writing, the write sense amplifier 11 reads verified data from the memory cells via the read data buses RDB1 through RDB1m. With the write sense amplifier 11, program verification can be performed for two words at once. At the time of high-speed writing, the write amplifier 12 writes data into the memory cells via the read data buses RDB1 through RDB1m. NMOS transistors 80 through 83 are switches that connect the write sense amplifier 4, the write amplifier 5, the write sense amplifier 11, and the write amplifier 12 to the read data buses RDB00 through RDB1m at the time of high-speed writing.

The bit lines BL of each of the banks BANK0 through BANKn are connected to the read data buses RDB00 through RDB1m via NMOS transistors 600 through 6n3 that have the bank select signals RSEL0 through RSELn as gate inputs. The bit lines BL of each of the banks BANK0 through BANKn are also connected to the write data buses WDB0 through WDBm via NMOS transistors 700 through 7n3 that have the bank select signals WSEL00 through WSEL1n as gate inputs. Here, m is an input/output serial number that is an integer of 0 through 15.

When the banks BANK0 through BANKn are in a reading state, the bank select signal RSELn switches to high level, and the read sense amplifier 3 reads the data of two words via the read data buses RDB00 through RDB1m. When the bank BANKn is in a programming or verifying state, the bank select signal WSEL0n or WSEL1n switches to high level, and the write sense amplifier 4 and the write amplifier 5 perform programming or verification of one word via the write data buses WDB0 through WDBm.

Normally, the bank select signals RSELn, WSEL0n, and WSEL1n are controlled in each of the banks BANK0 through BANKn, so that reading and writing can be performed at the same time. Thus, a dual operating function is realized. At the time of high-speed writing, the signal FPGM switches to high level, and the write sense amplifier 4, the write amplifier 5, the write sense amplifier 11, and the write amplifier 12 are connected to the read data buses RDB00 through RDB1m via the NMOS transistors 80 through 83. Thus, programming or program verification can be performed on two words at once.

As described above, in the second embodiment, the read data buses RDB00 through RDB1m have more lines than the write data buses WDB0 through WDBm. Accordingly, at the time of high-speed writing, writing is performed on a number of bits only via the read data buses RDB00 through RDB1m. In this case, the bank select signals RSELn, WSEL0n, and WSEL1n can be more easily controlled.

Figure 7:
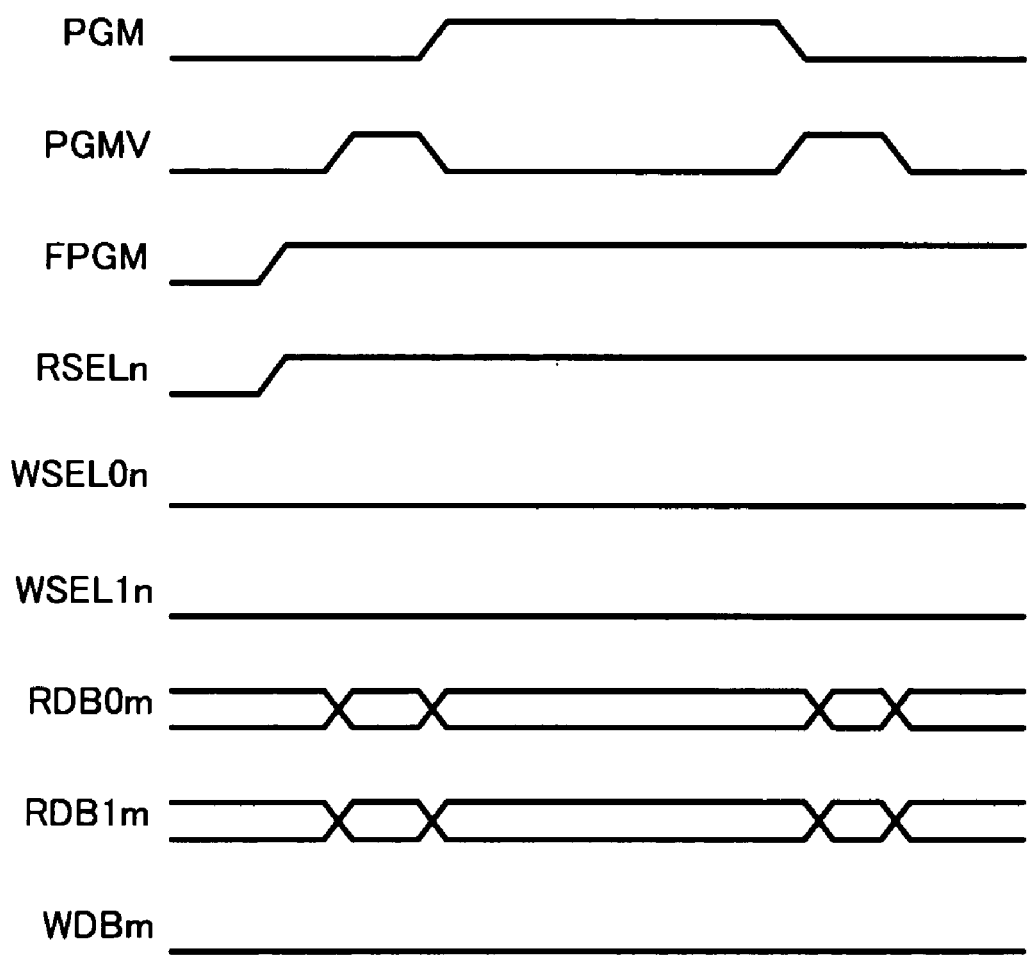
FIG. 7 is a timing chart of a high-speed writing operation of the semiconductor device in accordance with the second embodiment.

FIG. 7 is a timing chart of a high-speed writing operation of the semiconductor device in accordance with the second embodiment. When high-speed writing is performed on the bank BANKn, the signal FPGM and the bank select signal RSELn become HIGH. During a program verifying period, with the signal PGMV being HIGH, verified data are supplied to the read data buses RDB0m and RDB1m, and program verification is then performed. During a programming period, with the signal PGM being HIGH, a program voltage is supplied to the read data buses RDB0m and RDB1m, and writing is performed on 32 bits at once.

In a program verifying period, with the signal PGMV being HIGH, verified data are supplied to the read data buses RDB0m and RDB1m, and program verification is performed. If program verification passes, the high-speed writing comes to an end, and the signal FPGM becomes LOW. If another high-speed data writing operation is to follow, the command FPGM is again input, and the same procedures are repeated.

In accordance with the second embodiment, the memory has read data buses suitable for a number of words, like a burst mode structure of a page mode structure, and the read data buses are used as write data buses at the time of high-speed writing. Accordingly, a large number of bits can be written at once, and high-speed writing can be performed.

Third Embodiment

Figure 8:
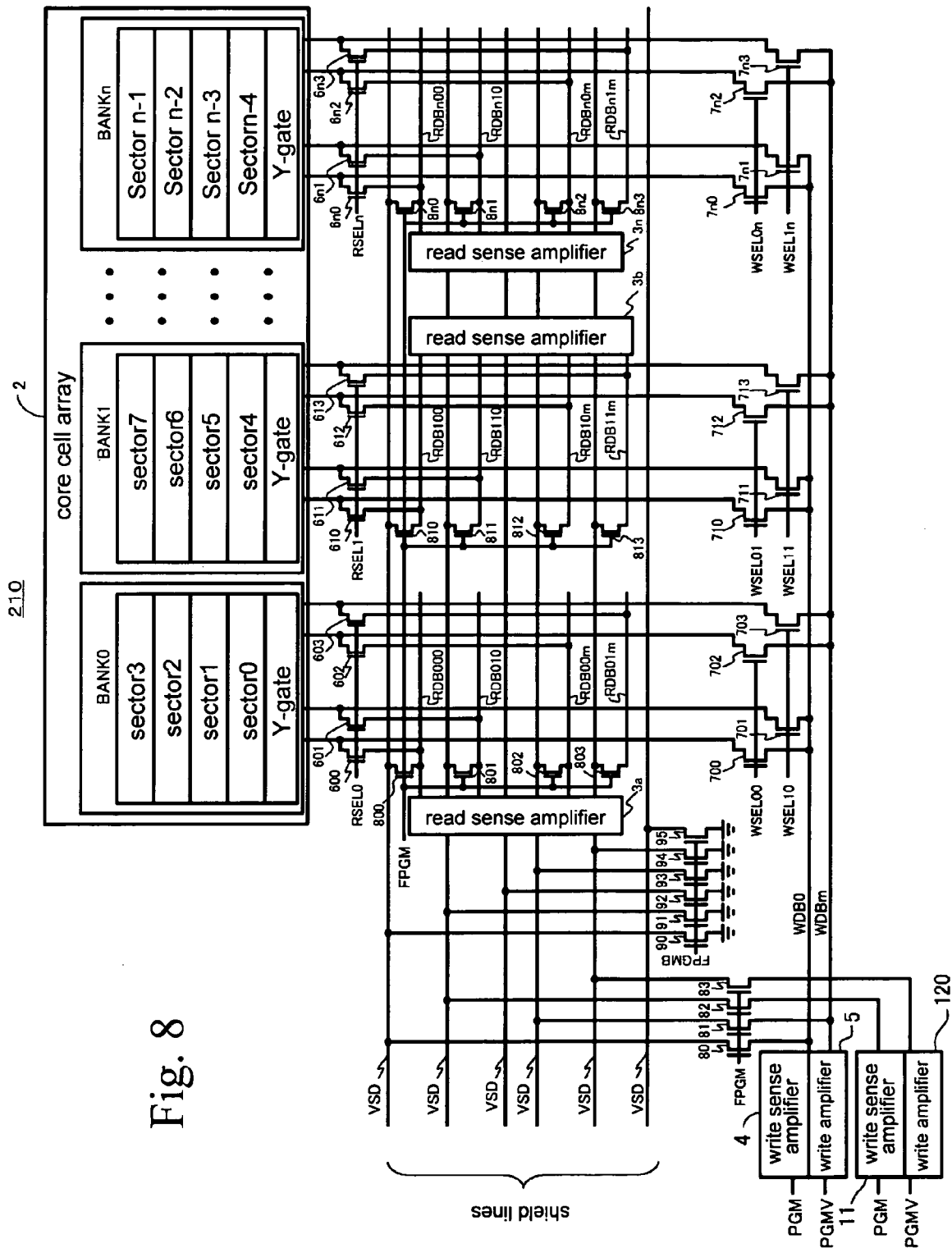
FIG. 8 illustrates the structure of a semiconductor device in accordance with a third embodiment.

Next, a third embodiment is described. FIG. 8 illustrates the structure of a semiconductor device in accordance with a third embodiment of the present invention. In the third embodiment, each bank has two or more read data buses. As shown in FIG. 8, the semiconductor device 210 includes a core cell array 2, read sense amplifiers 3a through 3n, a write sense amplifier 4, a write amplifier 5, a write sense amplifier 11, and a write amplifier 120. Like the semiconductor device of the first embodiment, the semiconductor 210 further includes a control logic 13, an address buffer 14, and a bank select circuit 15.

The semiconductor device 210 is of a dual operation type that can read data from a part while erasing or writing data in another part, and operates in page mode or burst mode. Write data buses WDB0 through WDBm are used to write data in memory cells. Read data buses RDB000 through RDBn1m are used to read data from the memory cells. The read data buses RDB000 through RDBn1m are provided for each of the banks BANK0 through BANKn. Shield lines VSD shield the read data buses RDB000 through RDBn1m.

The core cell array 2 includes banks BANK0 through BANKn that can read data from the memory cell of a second bank while writing data into the memory cell of a first bank.

The memory cell of each of the banks BANK0 through BANKn is formed with sectors. Each of the read sense amplifiers 3a through 3n reads data from the memory cells via the read data buses RDB000 through RDBn1m. The read sense amplifiers 3a through 3n are provided for each bank.

At the time of regular writing, the write sense amplifier 4 reads verified data from the memory cells via the write data buses WDB0 through WDBm. Also, at the time of regular writing, the write amplifier 5 writes data via the write data buses WDB0 through WDBm. The write sense amplifier 11 is a sense amplifier for high-speed programming. At the time of high-speed writing, the write sense amplifier 11 reads verified data from the memory cells via the shield lines VSD. With the write sense amplifier 11, program verification can be performed for two words at once. At the time of high-speed writing, the write amplifiers 5 and 120 write data into the memory cells via the shield lines VSD.

NMOS transistors 80 through 83 are switches that connect the write sense amplifier 4, the write amplifier 5, the write sense amplifier 11, and the write amplifier 120 to the shield lines VSD at the time of high-speed writing. NMOS transistors 800 through 8n4 are switches that connect bit lines BL to the shield lines VSD via the read data buses RDB000 through RDBn1m at the time of high-speed writing.

The bit lines BL of the bank BANKn are connected to the read data buses RDBn0n through RDBn1m via NMOS transistors 6n0 through 6n3 that have the bank select signal RSELn as a gate input. Thus, reading of two words is performed. The bit lines BL of the bank BANKn are also connected to the write data buses WDB0 through WDBm via NMOS transistors 7n0 and 7n2 or NMOS transistors 7n1 and 7n3 that have the bank select signals WSEL0n through WSEL1n as gate inputs. Thus, programming of one word is performed. Here, m is an input/output serial number that is an integer of 0 through 15.

Each of the read data buses RDB000 through RDBn1m are shielded by the shield lines VSD to reduce the influence from the neighboring read data buses. Being shared by the banks, the shield lines VSD are used as data buses at the time of high-speed writing. Normally, the signal FPGMB is at high level, and the shield lines VSD are connected to a ground VSS via NMOS transistors 90 through 95. At the time of high-speed writing, the signal FPGMB switches to low level, and the shield lines VSD are cut off the ground VSS. As the signal FPGM switches to high level, the write sense amplifier 4 and the write amplifier 5 are connected to the read data buses RDBn00 through RDBn0m of the bank BANKn, and the write sense amplifier 11 and the write amplifier 120 are connected to the read data buses RDBn10 through RDBn1m of the bank BANKn. Thus, high-speed writing and verification can be performed for two words at once.

Figure 9:
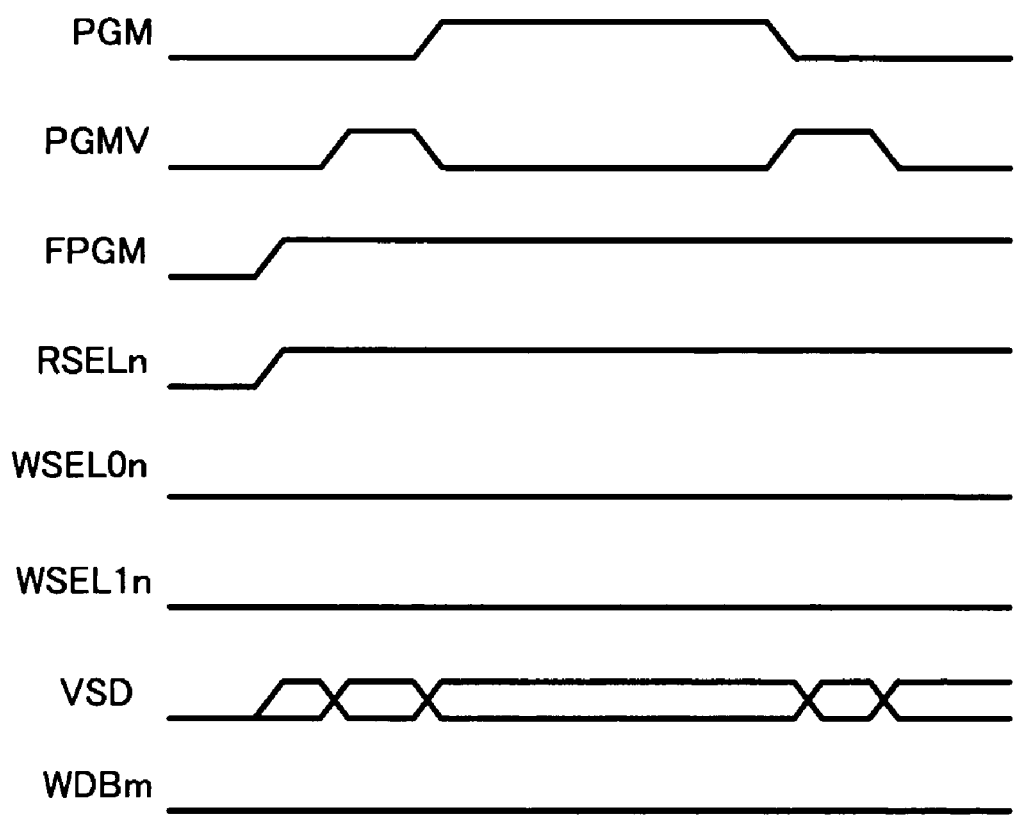
FIG. 9 is a timing chart of a high-speed writing operation of the semiconductor device in accordance with the third embodiment.

FIG. 9 is a timing chart of a high-speed writing operation of the semiconductor device in accordance with the third embodiment. When high-speed writing is performed on the bank BANKn, the signal FPGM and the bank select signal RSELn become HIGH. During a program verifying period, with the signal PGMV being HIGH, verified data are supplied to the shield lines VSD, and program verification is then performed. During a programming period, with the signal PGM being HIGH, a program voltage is supplied to the shield lines VSD, and writing of 32 bits is performed at once.

In a program verifying period, with the signal PGMV being HIGH, verified data are supplied to the shield lines VSD, and program verification is performed. If program verification passes, the high-speed writing comes to an end, and the signal FPGM becomes LOW. If another high-speed data writing operation is to follow, the command FPGM is again input, and the same procedures are repeated.

In accordance with the third embodiment, read data buses are provided for each bank, and the shield lines of the read data buses are used as write data buses at the time of high-speed writing. Thus, a large number of bits can be written at once, and high-speed writing can be realized.

In the first and second embodiment, the shield lines VSD may be used to perform high-speed writing.

The write amplifier 12, the write amplifier 5, the write amplifiers 5 and 120, the write sense amplifier 11, the write sense amplifier 4, the write sense amplifiers 4 and 11, the bank select circuit 15 are equivalent to the first write amplifier, the second write amplifier, the third write amplifier, the first sense amplifier, the second sense amplifier, the third sense amplifier, and the select circuit in claims, respectively. The NMOS transistors 600 through 6n3 are equivalent to the switches that select the bank to be connected to the read data buses from the banks.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A semiconductor device comprising:
   a write data bus via which data are written into memory cells;
   a read data bus via which data are read from the memory cells; and
   a first write amplifier that writes data into the memory cells via the read data bus at the time of given writing.

2. The semiconductor device as claimed in claim 1, further comprising
   a second write amplifier that writes data into the memory cells via the write data bus at the time of given writing.

3. The semiconductor device as claimed in claim 1, further comprising:
   shield lines that shield the read data bus; and
   an additional write amplifier that writes data into the memory cells via the shield lines at the time of given writing.

4. The semiconductor device as claimed in claim 1, further comprising
   a first sense amplifier that reads verified data from the memory cells via the read data bus.

5. The semiconductor device as claimed in claim 1, further comprising
   a sense amplifier that reads verified data from the memory cells via the write data bus.

6. The semiconductor device as claimed in claim 3, further comprising
   a sense amplifier that reads verified data from the memory cells via the shield lines.

7. The semiconductor device as claimed in claim 1, further comprising
   a sense amplifier that reads data from the memory cells via the read data bus.

8. The semiconductor device as claimed in claim 1, further comprising
   a cell array including a plurality of banks in which data are read from a first one of the banks while data are written into a second one of the banks.

9. The semiconductor device as claimed in claim 3, further comprising:

a cell array including a plurality of banks in which data are read from a first one of the banks while data are written into a second one of the banks; and sense amplifiers each of which is provided for a respective one of the banks, each of the sense amplifiers reading data from the memory cells via the read data bus.

10. The semiconductor device as claimed in claim 3, further comprising a cell array including a plurality of banks in which data are read from a first one of the banks while data are written into a second one of the banks, wherein the read data bus is provided for each of the banks.

11. The semiconductor device as claimed in claim 1, further comprising:

a cell array including a plurality of banks in which data are read from a first one of the banks while data are written into a second one of the banks; and a select circuit that generates a select signal for bank selection.

12. The semiconductor device as claimed in claim 1, further comprising a switch that connects the first write amplifier to the read data bus at the time of given writing.

13. The semiconductor device as claimed in claim 3, further comprising a switch that connects the third write amplifier to the shield lines at the time of given writing.

14. The semiconductor device as claimed in claim 1, further comprising:

a cell array including a plurality of banks in which data are read from a first one of the banks while data are written into a second one of the banks; and a switch that selects one of the banks to be connected to the read data bus.

15. The semiconductor device as claimed in claim 3, further comprising:

a cell array including a plurality of banks in which data are read from a first one of the banks while data are written into a second one of the banks; and a switch that selects one of the banks to be connected to the shield lines.

16. The semiconductor device as claimed in claim 1, wherein the read data bus has a larger number of lines than the write data bus.

17. The semiconductor device as claimed in claim 1, wherein the semiconductor device is a semiconductor memory device.

18. A method of writing data comprising the steps of:
writing data into memory cells via a write data bus;
reading data from the memory cells via a read data bus; and
writing data into the memory cells via the read data bus at the time of given writing.

19. The method as claimed in claim 18, further comprising the step of
writing data into the memory cells via the write data bus at the time of given writing.

20. The method as claimed in claim 18, further comprising the step of
writing, at the time of given writing, data into the memory cells via shield lines that shield the read data bus.

21. The method as claimed in claim 18, further comprising the step of
reading verified data from the memory cells via the read data bus.

22. The method as claimed in claim 18, further comprising the step of
reading verified data from the memory cells via the write data bus.

23. The method as claimed in claim 20, further comprising the step of
reading verified data from the memory cells via the shield lines.

24. The method as claimed in claim 18, further comprising the step of
generating a select signal that selects one of banks that have the memory cells.

25. The method as claimed in claim 18, further comprising the step of
reading data from a second one of banks while writing data into a first one of the banks.

* * * * *